United States Patent [19]

Anderson et al.

[11] 4,066,819
[45] Jan. 3, 1978

[54] METHOD OF BONDING GOLD FILMS TO NON-ELECTRICALLY CONDUCTING OXIDES AND PRODUCT THEREBY OBTAINED

[75] Inventors: Wallace E. Anderson, Beltsville; Albert M. Syeles, Silver Spring; Albert D. Krall, Rockville, all of Md.

[73] Assignee: The United States of America as represented by the Secretary of the Navy, Washington, D.C.

[21] Appl. No.: 191,292

[22] Filed: Oct. 21, 1971

[51] Int. Cl.² .......................................... B32B 15/04
[52] U.S. Cl. ................................. 428/472; 75/165;
427/124; 427/125; 428/538
[58] Field of Search ................. 161/213; 252/514;
117/227, 107; 317/234 L; 29/195; 75/165;
427/125, 124, 250, 248 B; 428/472, 538

[56] References Cited

U.S. PATENT DOCUMENTS

| | | | |
|---|---|---|---|
| 2,450,851 | 10/1948 | Colbert et al. | 117/107 |
| 2,842,463 | 7/1958 | Bond et al. | 117/107 |
| 3,326,720 | 6/1967 | Bruhl, Jr. et al. | 252/514 |
| 3,356,982 | 12/1967 | Solow | 252/514 |
| 3,769,006 | 10/1973 | Ingersoll | 75/165 |

OTHER PUBLICATIONS

Brennan et al., *Effect of Nature of Surfaces on Wetting of Sapphire by Liquid Aluminum*, In. J. of Am. Ceramic Soc., 51(10): p. 596, 1968.

*Primary Examiner*—Cameron K. Weiffenbach
*Attorney, Agent, or Firm*—R. S. Sciascia; A. L. Branning

[57] ABSTRACT

A microstrip board comprising a gold film which contains about at least ½ weight per cent of aluminum bonded to a non-electrical conducting oxide is prepared by simultaneously evaporating the gold and aluminum onto the non-electrical conducting oxide and thereafter optionally heating the film thus formed.

3 Claims, 1 Drawing Figure

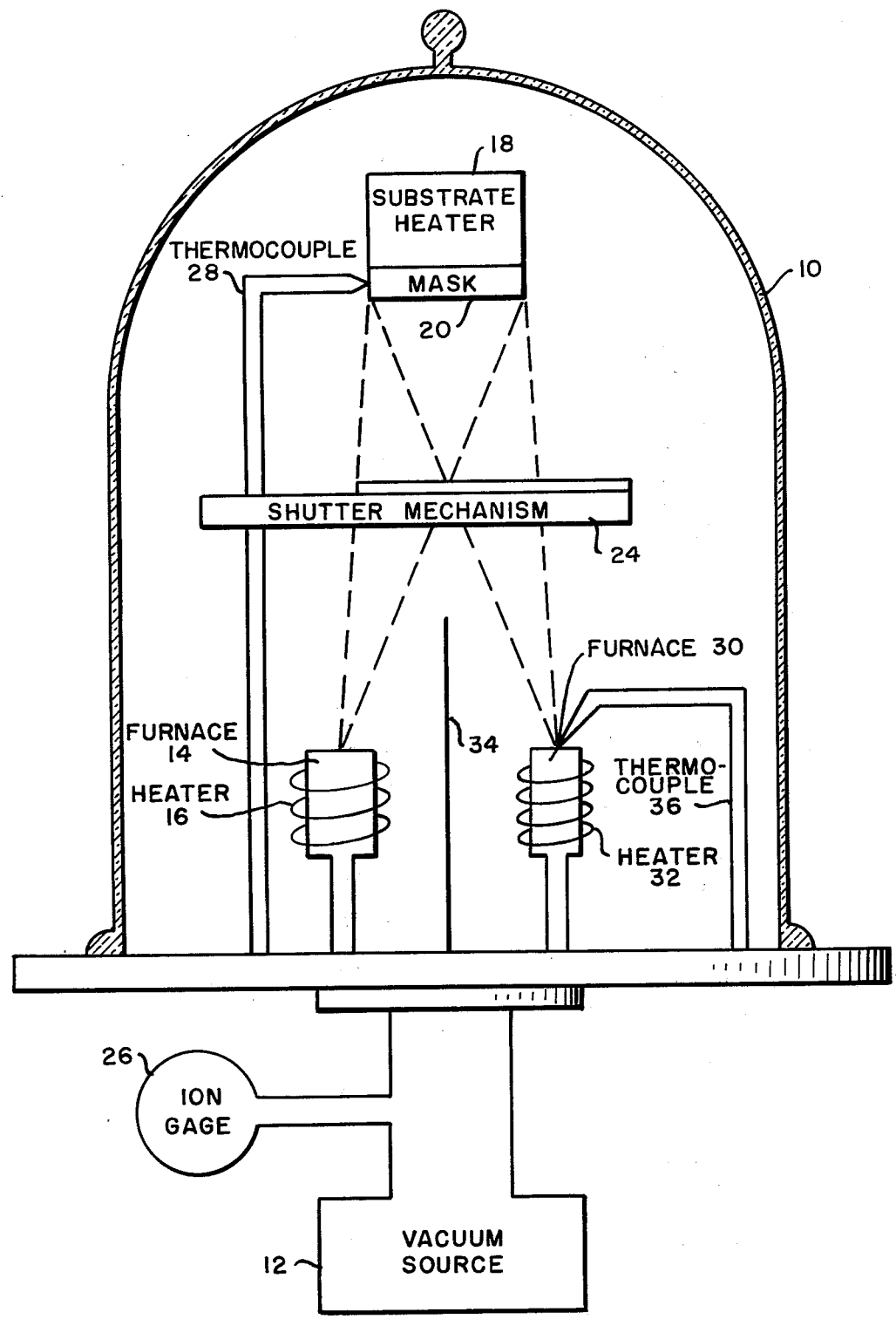

METHOD OF BONDING GOLD FILMS TO NON-ELECTRICALLY CONDUCTING OXIDES AND PRODUCT THEREBY OBTAINED

BACKGROUND OF THE INVENTION

Thin electrically conducting films of gold are bonded to non-electrical conducting oxides such as alumina to form what is commonly referred to as microstrip boards. These boards find use in conducting high frequency electrical energy of microwaves and in a number of other applications.

However, it is fairly difficult to attach a thin film of gold to non-conducting oxides such as alumina. The current practice with alumina, for example, is to evaporate a thin film of chromium followed by the evaporation of gold. The substrate's temperature must be controlled at high values during the evaporation to effect a good oxide-chromium bond and to properly form an alloying type of bond between the chromium and gold. Although the resulting metalization is an electrical conductor, adheres well and is suitable for conventional chemical milling procedures providing that each metal involved be etched separately, this process suffers from a number of disadvantages. Thus great care must be taken to apply a layer of chromium sufficiently thick for bonding the gold but not so thick that the electrical resistance of the film is affected by the chromium. Furthermore, the two-step process involved in etching the desired pattern is cumbersome and requires the expense of using two different solutions. With respect to expense, it should also be noted that at times chromium becomes rather scarce and hence it can be very expensive. Additionally, control of the substrate temperature during evaporation is difficult and the chromium-gold interfacial alloy is difficult to etch.

In view of these difficulties, research has been conducted to find easier ways to bond gold films to non-electrical conducting oxides.

SUMMARY OF THE INVENTION

Accordingly, one object of this invention is to provide a method of bonding gold films to non-electrical conducting oxides.

Another object of this invention is to provide a gold film which is attached to a non-electrical conducting oxide which finds use as a microstrip board.

A further object of this invention is to provide a one-step process for bonding gold films to non-electrical conducting oxides.

A still further object of this invention is to provide a gold film which is attached to a non-electrical conducting oxide which can be etched in one step.

Yet a further object of this invention is to provide a method for the preparation of gold films which are attached to non-electrical conducting oxides which does not require the accurate deposition and adjustment of thickness of another material besides gold.

A still further object of this invention is to provide a method for the bonding of gold films to non-electrical conducting oxides which can be performed in a relatively short period of time.

Another object of this invention is to provide a method for the bonding of gold films to non-electrical conducting oxides which uses relatively inexpensive materials.

These and other objects of this invention are accomplished by providing an article wherein a gold film which contains at least about ½ weight per cent of aluminum, chromium or nickel, is bonded to a non-electrical conducting oxide which is formed by the simultaneous evaporation of gold and aluminum, chromium or nickel, onto the non-electrical conducting oxide.

BRIEF DESCRIPTION OF THE DRAWINGS

Other objects and many of the attendant advantages of the present invention will be readily appreciated as the same becomes better understood by reference to the following detailed description when considered in connection with the accompanying drawing:

The solitary FIGURE is a schematic diagram of the evaporation apparatus in which the process of this invention may be carried out to produce the products of this invention.

DESCRIPTION OF THE PREFERRED EMBODIMENTS

Referring now in greater detail to the solitary FIGURE of the drawing, the evaporation apparatus, in which the process of this invention may be conducted, is shown as including a bell jar 10 connected to any standard vacuum source 12. Disposed within bell jar 10 is a first furnace 14, in which the material to be vaporized is placed and a heater coil 16, which may be made of nichrome or molybdenum, for heating the material. The substrate is placed in a substrate heater 18 which may have a mask 20 (if desired) interposed between the substrate and heater 14. A movable shutter mechanism 24 may be interposed between mask 20 and furnace 14. An ion gage 26 is provided to measure the partial pressure in the apparatus. Additionally, a thermocouple 28 may be used to measure the temperature of the substrate. Furthermore, a second furnace 30 may also be disposed within bell jar 10 to evaporate material. Thus instead of evaporating the gold and aluminum from one furnace, one can place quantities of each of these materials in a separate furnace and individually control the temperature of each furnace so as to achieve the desired partial pressure of each material. Furnace 30 also has a heating coil around it which may be made of nichrome or molybdenum. The nature of furnaces 14 and 30 is not limited to that disclosed herein but may also be a flash evaportion, induction heating or electron bombardment type furnace. A partition 34 may be placed between the two furnaces to prevent interaction therebetween. A thermocouple 36 is included to determine the temperature of furnace 30.

The gold films which are prepared by the process of this invention contain gold and at least about ½ weight per cent of a material selected from the group consisting of aluminum, chromium and nickel with aluminum being most preferred. Although it is desirable to have as little aluminum, chromium or nickel as possible in the film, it has been found that adhesion to the non-electrically conducting oxide can be achieved only if these other metals are present to the extent of at least about ½ weight per cent. Furthermore, because these metals interfere with the gold films resistivity, it is preferred that they be present only to the extent of a maximum of about 5 weight per cent. Thus the gold films of this invention preferably contain ½–5 weight per cent of the second metal.

The non-electrically conducting oxide (which may also be termed an electrical insulating oxide) onto which the gold films are deposited to form the microstrip board are any of the art recognized oxides as, for example, alumina, silica, beryllium oxide, rutile, sapphire, mica and high silica content glass with alumina being the most preferred. Within the meaning of the present invention, the term "high silica content glass" is deemed to refer to glass which has a silica content of over 50 weight per cent.

The deposition is carried out by using the vacuum deposition apparatus hereinbefore described. The charges of gold and the second metal are weighed out and are both placed in one furnace. It should be noted that one may place gold in one of the furnaces and the other metal in the second furnace if desired. The system is evacuated to a pressure of at least about $10^{-5}$ Torr, for it has been found to be substantially more difficult to deposit material at pressures substantially higher than this. It has also been found advisable to heat the substrate in order to degas it. Since water vapor is one of the most difficult materials to degas and it can be degassed at about 250°–300° C, it is advisable to heat the substrate to at least 250°–300° C. After degassing, the furnace temperature should be adjusted to obtain the desired vapor pressure of the materials to be deposited. One may keep the shutter closed until the desired temperature is reached and then open it to effect deposition onto the substrate. When the desired deposition has occurred, the shutter would again be closed.

Although it is not necessary, it has been found desirable to heat the gold film after it has been deposited on the substrate. The temperature used for heating may vary from no heating at all up to the melting point of the alloy.

The general nature of the invention having been set forth, the following examples are presented as specific illustrations thereof. It will be understood that the invention is not limited to these specific examples but is susceptible to various modifications that will be recognized by one of ordinary skill in the art.

EXAMPLE

A charge of 904 mg of 99.9% pure gold and 19 mg of 99.9% pure aluminum were inserted in a furnace. The chamber was evacuated to a pressure of about 2 to $4 \times 10^{-6}$ Torr, and the alumina board was preheated to about 500° C. The furnace temperature was raised to about 1300° C and deposition was allowed to occur for about 1½ minutes. After this time had passed, deposition was stopped and the film on the alumina was heated at about 500° C for 2½ minutes while the vacuum was still maintained.

The gold alloy films that are produced in this manner are generally less than about 100,000 Å in thickness.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the U.S. is:

1. A microstrip board comprising a gold film which contains at least one-half weight percent of aluminum, bonded to a non-electrical conducting oxide of alumina.

2. A microstrip board comprising a gold film which contains one-half to five weight percent of aluminum, bonded to a non-electrical conducting oxide of alumina.

3. A microstrip board comprising a gold film which contains about two weight percent of aluminum, bonded to a non-electrical conducting oxide of alumina.

* * * * *